(12) United States Patent
Sato

(10) Patent No.: US 8,476,860 B2
(45) Date of Patent: Jul. 2, 2013

(54) ELECTRIC POWER CONVERTER

(75) Inventor: Ikuya Sato, Sagamihara (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 358 days.

(21) Appl. No.: 12/929,948

(22) Filed: Feb. 25, 2011

(65) Prior Publication Data

US 2011/0215751 A1 Sep. 8, 2011

(30) Foreign Application Priority Data

Feb. 26, 2010 (JP) ................................. 2010-043493

(51) Int. Cl.
*G01R 31/02* (2006.01)

(52) U.S. Cl.
USPC ........................ 318/490; 318/721; 318/400.13

(58) Field of Classification Search
USPC .......... 318/490, 721, 400.13, 400.04, 400.07, 318/400.02, 494, 717; 340/514
See application file for complete search history.

(56) References Cited

U.S. PATENT DOCUMENTS

| 4,554,533 A * | 11/1985 | Bosnak .......................... 340/514 |
| 7,253,577 B2 | 8/2007 | Campbell et al. |
| 2010/0309589 A1 | 12/2010 | Ueki et al. |

FOREIGN PATENT DOCUMENTS

JP 2010-284051 A 12/2010

* cited by examiner

*Primary Examiner* — Karen Masih
(74) *Attorney, Agent, or Firm* — Rabin & Berdo, P.C.

(57) ABSTRACT

An electric power converter includes a control unit outputting a PWM signal, a bridge circuit producing AC electric power supplied to a motor by turning semiconductor switching devices in the bridge on and off in response to PWM signals, a cut off unit cutting the PWM signals off from the bridge circuit in response to a gate signal, and a monitoring unit generating a test signal for checking the cut off unit. The cut off unit includes a switching circuit switching between the test signal and an external cut off signal, and a delay circuit that delays the output of the switching circuit. The arrangement enables the electric power converter to monitor as to whether the cut off unit is abnormal without stopping the operation of the electric power converter.

7 Claims, 8 Drawing Sheets

ELECTRIC POWER CONVERTER

CROSS-REFERENCE TO RELATED APPLICATION

This application claims the benefit of foreign priority of Japanese application 2010-043493, filed Feb. 26, 2010, the disclosure of which is incorporated herein by reference.

FIELD OF THE INVENTION

The present invention relates to an electric power converter that can detect an abnormality of a cut off unit that cuts off a driving signal of a semiconductor switching device.

BACKGROUND ART

In recent years, the necessity of energy saving has been enhancing the widespread use of electric power converters such as inverters and servo-amplifiers carrying out variable speed driving of motors. Since abnormal operation of electrical devices sometimes results in serious accidents, device makers are required to make the devices provide full safety functions. Moreover, in each of the steps of development, design, production, maintenance and disposal of a product, strict standards are established for restricting dangers to the human body within allowable limits.

In particular, with respect to electrical devices, there are established the functional safety standard of IEC61508 and the standard of IEC61800-5-2 in which safety of motor driven systems such as inverters and servo amplifiers are taken into consideration.

For making the electrical devices meet the safety standards, it becomes necessary for manufacturers of the electrical devices not only to prepare documents with respect to the system and the concept of the development of the devices for receiving certifications as to whether the electrical devices are in conformity with the standards, but also to have the components that are used to satisfy the safety levels of the failure rates. The manufacturers also need to provide a monitoring function that monitors abnormalities of devices relating to safety functions together with a function that safely stops the devices according to specifications.

For stopping a motor, there is a safety torque-off (STO) function that cuts off the supply of energy to the motor. For a related technology with respect to the safety torque-off function, a safety device is described in U.S. Pat. No. 7,253,577, for example. The safety device is provided with a gate circuit (cut off device) between a main circuit that supplies electric power for driving a motor and a control device that produces a control signal for controlling semiconductor switching devices in the main circuit. By closing the gate circuit to cut off the control signal by a cut off instruction from an independently provided safety functional circuit, the supply of the electric power from the main circuit is stopped. The safety functional circuit, as one of the cut off conditions of the gate circuit, outputs the cut off instruction when a safety torque-off instruction (cut off signal) is externally inputted.

The cut off signal, however, being a signal that is not always inputted, makes it not sure in the related cut off device whether the gate circuit operates normally when the cut off signal is actually inputted. An attempt to input a simulated cut off signal for confirming whether the safety torque-off function is normally working or not requires the operation of the electric power converter to be stopped and causes the problem of reducing operating efficiency.

SUMMARY OF THE INVENTION

The invention was made in view of the situation explained above, with an object of providing an electric power converter that can monitor whether or not an abnormality is presented in the connection with a gate circuit in an operating state of the electric power converter, without stopping the electric power converter.

For achieving the above object, an electric power converter according to the invention is an electric power converter including: a control unit outputting a PWM signal; a bridge circuit producing AC electric power supplied to a motor by making semiconductor switching devices turned-on and -off by the PWM signal; a cut off unit provided between the control unit and the bridge circuit for cutting off the PWM signal supplied to the bridge circuit from the control unit by a gate signal; and a monitoring unit generating a test signal for checking the cut off unit, and the electric power converter is characterized in that the cut off unit includes: a switching circuit switching between the test signal and an external cut off signal to output one of the signals; a delay circuit having the output signal of the switching circuit inputted to allow the output signal to pass through the circuit after a preset time has elapsed from the time at which the output signal is changed; and a unit for outputting the signal inputted to the delay circuit to the monitoring unit as a feedback signal, and the monitoring unit outputs a test signal with a duration being shorter than a delay time as being the preset time to make a decision as to whether the feedback signal outputted from the cut off unit is in agreement with the test signal and, when both of the signals are in disagreement with each other, making a decision that the state is abnormal.

In the electric power converter according to the invention, a test signal is made generated with a duration being shorter than the allowable delay time of the cut off signal and is transmitted to the cut off unit. In the cut off unit, either one of the cut off signal or the test signal is selected to be inputted to the gate circuit in the cut off unit through the delay circuit. The delay circuit let only a cut off signal pass through so that no PWM signal is cut off by the test signal.

Moreover, instead of the switching circuit, a synthesizing circuit can be provided which carries out an operation of OR logic between the test signal and the externally given cut off signal so that the output of the synthesizing circuit is inputted to the delay circuit.

The monitoring unit in the electric power converter according to the invention is characterized in that the monitoring unit further has the cut off signal and the output signal of the cut off unit inputted to make a decision as to whether the cut off signal is inputted or not when the test signal and the feedback signal are in disagreement with each other, and to make a decision as to whether the cut off unit is abnormal or not on the basis of the output signal of the cut off unit when the cut off signal is inputted.

In the invention, by the generated test signal and the feedback signal from the cut off unit, abnormalities on the cut off unit side including an abnormality in connection can be detected.

Moreover, the electric power converter according to the invention is characterized in that the cut off unit further includes: a first gate circuit cutting off PWM signals to upper arm semiconductor switching devices in the bridge circuit; and a second gate circuit cutting off PWM signals to lower arm semiconductor switching devices in the bridge circuit, each of the first gate circuit and second gate circuit having the switching circuit and the delay circuit provided as its own ones. By separately providing the gate circuit for the upper arm and that for the lower arm in the bridge circuit with each made to be provided with the switching circuit and the delay circuit for making the gate circuits doubled, an electric power converter with high reliability can be constructed.

As was explained in the foregoing, according to the invention, even in the case when no cut off signal is inputted, the electric power converter can carry out checking of the cut off unit at fixed timing to enable detection of abnormalities, which can enhance reliability of the electric power converter.

In addition, in the invention, the delay circuit is provided so that the gate of the cut off unit is not closed by the test signal for ascertaining the connection with the cut off unit. Furthermore, in the processing with a device such as a CPU, a pulse signal with a period shorter than the preset delay time is used as the test signal to allow the checking to be carried out while the electric power converter is in operation.

DESCRIPTION OF THE PREFERRED EMBODIMENT

In the following, an embodiment of the invention will be explained with reference to attached drawings.

Figure 1:
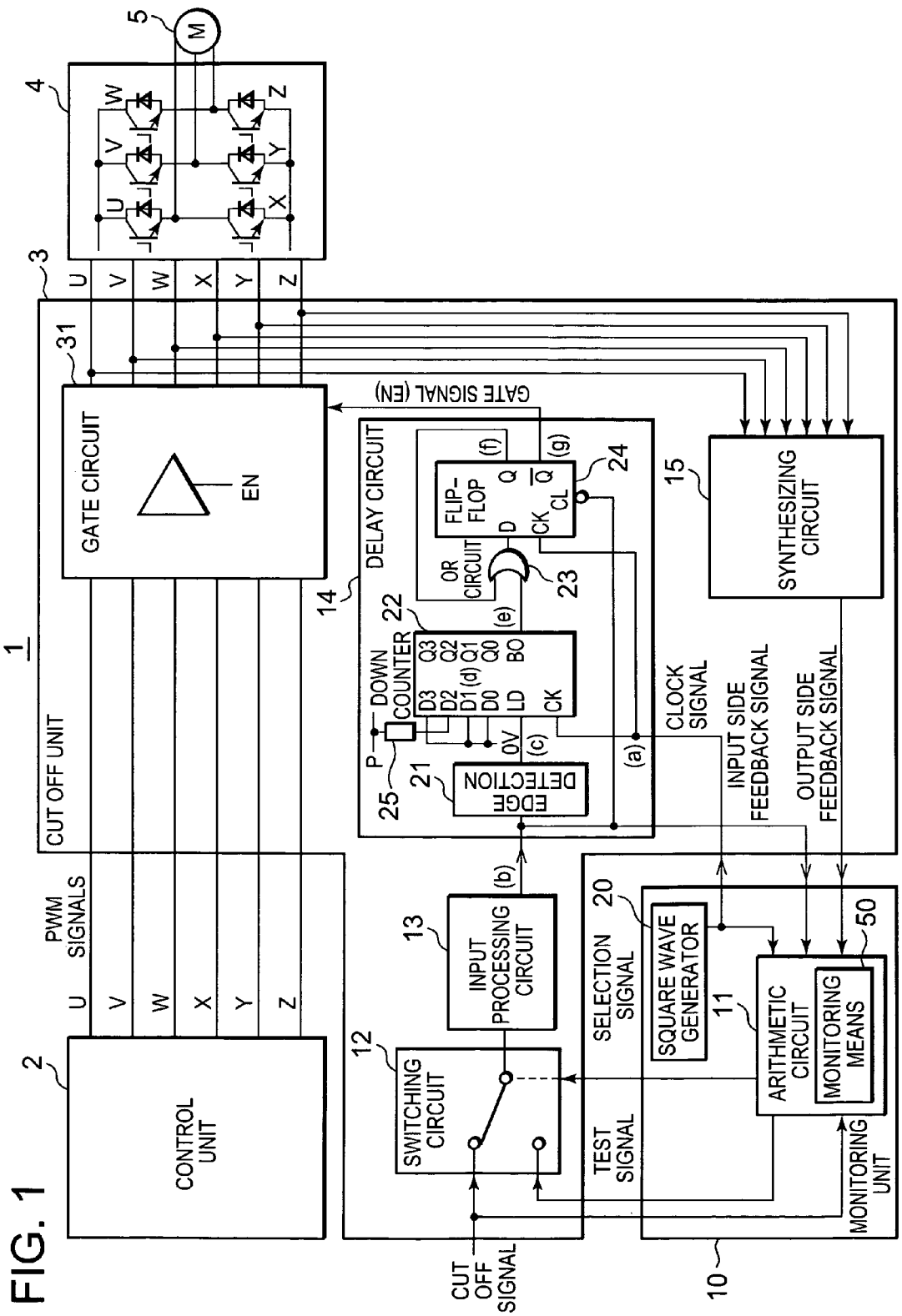
FIG. 1 is a block diagram showing the function of an example of an electric power converter according to an embodiment of the invention.

FIG. 1 is a block diagram showing an example of an electric power converter according to an embodiment of the invention. In FIG. 1, an electric power converter 1 is provided with a control unit 2 outputting PWM signals for carrying out variable-speed control of a motor 5, a bridge circuit 4 having semiconductor switching devices (IGBTs) to produce AC electric power by the PWM signals supplied from the control unit 2, a cut off unit 3 cutting off the PWM signals supplied from the control unit 2 to the bridge circuit 4, and a monitoring unit 10 detecting abnormalities of the cut off unit 3 and other units. By the AC electric power outputted from the bridge circuit 4, the motor 5 is driven.

The configuration of the electric power converter 1 will be further explained in detail. The control unit 2 receives signals such as signals for the speed, position and torque of the motor 5 which is connected to the electric power converter as a load. With the use of the inputted signals, the control unit 2 carries out operations for voltage instructions to be outputted by the bridge circuit 4. The control unit 2 produces the PWM signals to be inputted to the gates of the respective IGBTs in the bridge circuit 4 for controlling the IGBTs. The bridge circuit 4 is a three-phase bridge circuit in which six IGBTs are connected into a full bridge. The three-phase outputs of the three-phase bridge circuit 4 are connected to the motor 5.

The control unit 2, by using a CPU for controlling a common three phase inverter, outputs six PWM signals, namely, gate signals for IGBTs (U, V and W) in an upper arm and gate signals for IGBTs (X, Y and Z) in a lower arm. Incidentally, since a system by which the control unit 2 produces PWM signals is not the object of the invention, a conventional technology can be used for the system.

The cut off unit 3 makes the six PWM signals, outputted from the control unit 2, inputted to a buffer (hereinafter referred to as a "gate circuit") 31 with enable input terminals for inputting gate signals as enable signals (EN) controlling the gates of the respective IGBTs. When a cut off signal is effective, an enable signal (EN) inputted to the gate circuit 31 is made to be in an "off" state to make the outputs of the gate circuit 31 in "off" states. This causes the gates of the IGBTs in the bridge circuit 4 to be also made in "off" states to stop the supply of electric power to the motor 5. For a configuration for stopping the supply of electric power to the motor 5, in addition to the configuration of the cut off unit 3 shown in FIG. 1, there can be used a configuration of using logical sum or a configuration of switching outputs by devices such as selectors.

While, when the enable signal (EN) in the cut off unit 3 is in an "on" state, the six PWM signals outputted from the control unit 2 are inputted to the gates of their respective IGBTs in the bridge circuit 4, by which the IGBTs are driven to apply three-phase AC voltages to the motor 5.

Next, with respect to the circuit configuration of the cut off unit 3, an explanation will be made in more detail.

In FIG. 1, a cut off signal (safety torque-off signal) is externally inputted to the cut off unit 3. The cut off signal is to be outputted by an operator pressing an emergency stop button or by another monitoring circuit (not shown).

The cut off signal is inputted to a switching circuit 12 in the cut off unit 3. The switching circuit 12 is switched by a selection signal outputted from an arithmetic circuit 11 so as to select either the cut off signal or a test signal. A signal outputted from the switching circuit 12 is inputted to an input processing circuit 13. The input processing circuit 13 carries out processing such as those for level conversion of a signal voltage and for isolation for preventing external noises from entering, for example. While an output signal from the input processing circuit 13 is inputted to a delay circuit 14 that makes an input signal delayed by a certain time before being outputted, the output signal is also transmitted to the monitoring unit 10 for being inputted to the arithmetic circuit 11 as an input side feedback signal for carrying out a comparison with a test signal.

The delay circuit 14 is formed of circuits such as an edge detection circuit 21 that detects the leading or trailing edge of a signal from the input processing circuit 13 and outputs a one-shot pulse, a down counter 22 that loads an initial set value by the one-shot pulse and carries out count down for clock signals, and a D-type flip-flop (hereinafter referred to as a "DFF") 24 that latches a signal outputted from the down counter 22.

The configuration of the delay circuit 14 will be explained in more detail. A signal outputted from the input processing circuit 13 is inputted to the edge detection circuit 21. Then, an output of the edge detection circuit 21 is inputted to a load terminal (LD) of the down counter 22 as a single pulse signal. When the single pulse signal is inputted to the load terminal, the down counter 22 loads values inputted to input terminals D0 to D3 in that timing to set the values as initial values (referred to as "initial set values") at the start of counting. Then, for each clock signal pulse applied to a CK terminal, each of the initial set values is decremented in order. When the count value becomes zero, a taking down signal (BO signal) is outputted with its value taken as "1". The BO signal and the output signal from the output terminal Q of the DFF24 become input signals to an OR circuit 23. The output of the OR circuit 23 is connected to an input terminal (D) of the DFF 24.

Moreover, the clock signal terminal (CK) of the DFF 24 is connected to a square wave generator 20, the same clock signal source as that of the down counter 22, in the monitoring unit 10. The clear terminal (CL) of the DFF 24 is connected to the output of the input processing circuit 13. The inverted output terminal of the DFF 24 is, as an output terminal of a gate signal as an enable signal (EN), connected to the enable input terminal of the gate circuit 31.

The six outputs of the gate circuit 31 are synthesized in a synthesizing circuit 15, the output of which is inputted to the arithmetic circuit 11 in the monitoring unit 10 as an output side feedback signal. The synthesizing circuit 15 can be actualized by OR logic, for example.

The delay circuit 14 shown in FIG. 1 is an example. Therefore, the delay circuit 14 can be substituted by a circuit with another circuit configuration whichever satisfies the timing chart that will be explained in the following. For example, the configuration of the delay circuit 14, instead of the configuration using a counter, can be substituted by a configuration that makes an input signal delayed by a certain time by making use of a time constant of a CR filter.

Subsequent to this, by using timing charts shown in FIG. 2 and FIG. 3, the operation of the delay circuit 14 will be explained. The embodiment is characterized in that a test signal outputted from the arithmetic circuit 11 for testing a safety torque-off function is to be provided as a pulse signal with a duration being shorter than a delay time given in the delay circuit 14. The delay time is set beforehand as one of the above initial set values within a range accepted as a response characteristic of an electric power converter.

Figure 2:
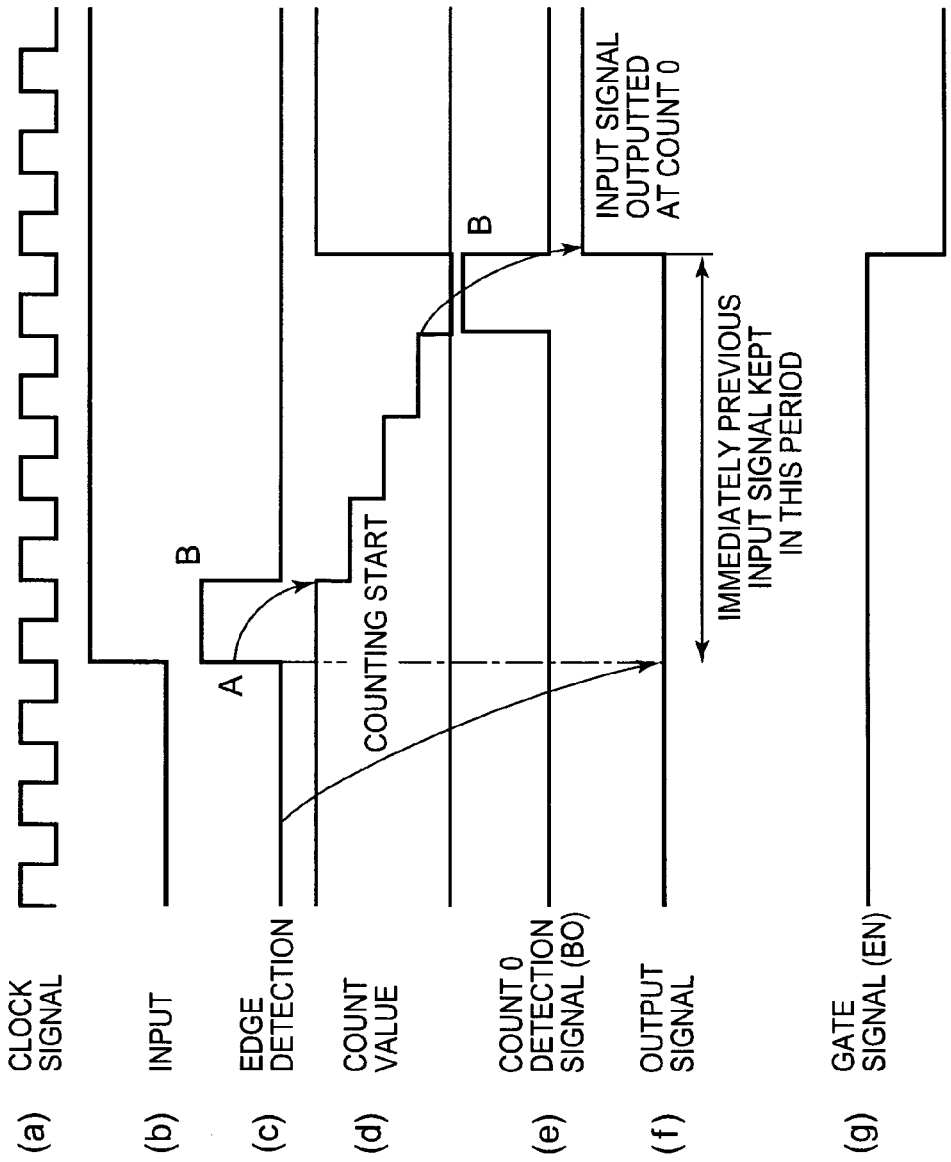
FIG. 2 is a timing chart for explaining an operation of the electric power converter shown in FIG. 1 in the case when an external cut off signal is selected.

FIG. 2 is a timing chart for explaining an operation of the electric power converter 1 shown in FIG. 1 in the case when an external cut off signal is selected by a selection signal outputted from the arithmetic circuit 11. In FIG. 2, the letters (a) to (g) identifying signal waveforms mean that the signal waveforms are those at positions with the same signs in FIG. 1.

A cut off signal selected by the switching circuit 12 is subjected to processing such as that of noise elimination by the input processing circuit 13 before being inputted to the edge detection circuit 21 in the delay circuit 14. From the edge detection circuit 21 in the delay circuit 14, a single pulse signal is outputted (the point A in FIG. 2) to be inputted to the load terminals (LD) of the down counter 22, by which an initial set value is loaded in the down counter 22. Thereafter, down counting is carries out until the count value becomes zero, that is, by a time determined by the initial set value and the period of the clock signal. The output (BO) of the down counter 22 becomes "0" except when the count value is zero and becomes "1" when the count value becomes zero (the point B in FIG. 2). The output (BO) is latched by the DFF 24. Namely, the DFF 24 is brought into a set state, which is maintained while an input signal to the delay circuit 14 is "1". When the input signal to the delay circuit 14 becomes "0", the DFF 24 is made reset. Therefore, after the DFF 24 is reset, a logical value of an input signal to the delay circuit 14 is to be outputted from the delay circuit 14.

Figure 3:
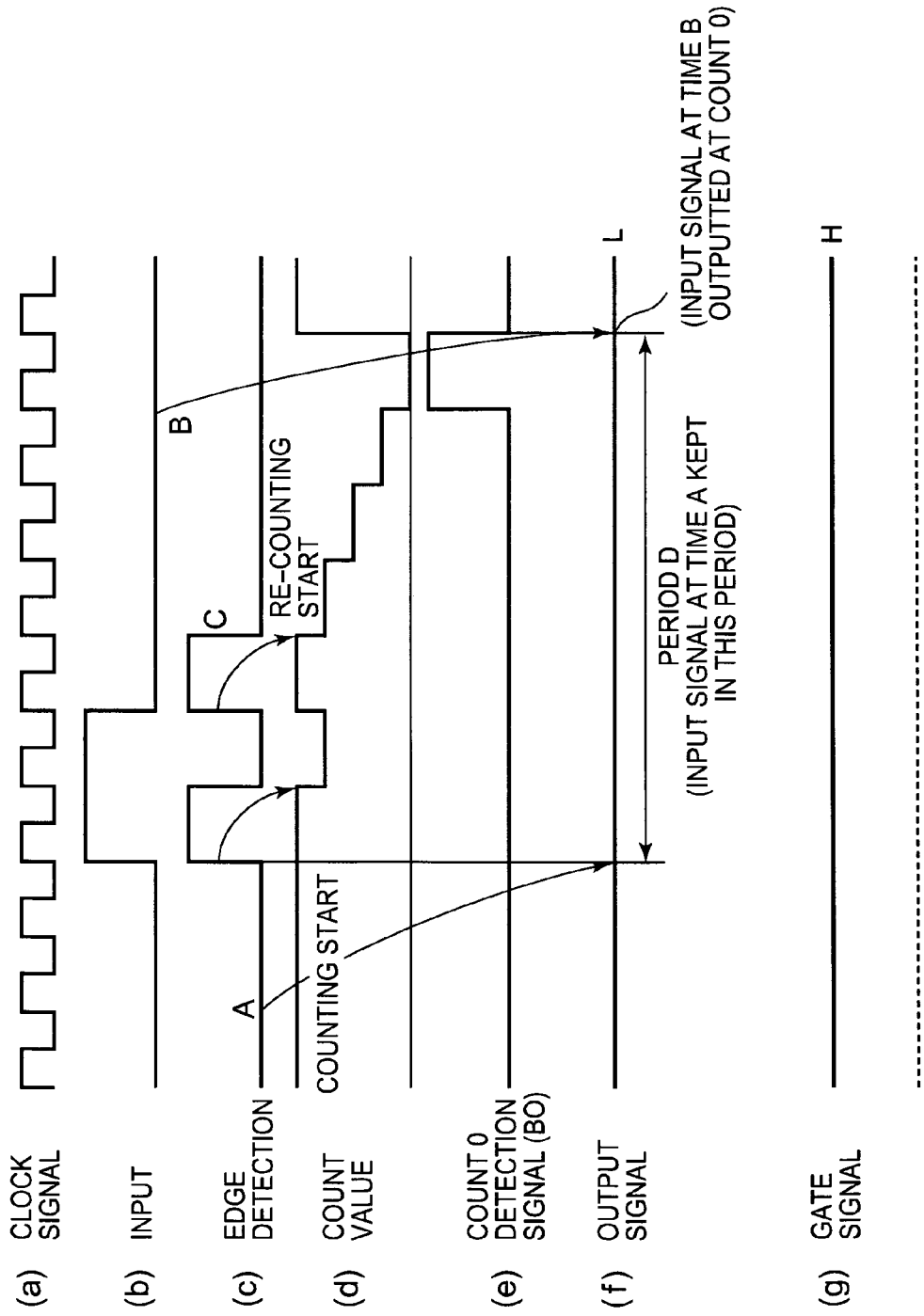
FIG. 3 is a timing chart for explaining an operation of the electric power converter shown in FIG. 1 in the case when a test signal is selected.

FIG. 3 is a timing chart for explaining an operation of the electric power converter 1 shown in FIG. 1 in the case when a test signal is selected by a selection signal outputted from the arithmetic circuit 11. For the test signal, as was explained in the foregoing, a signal with a period shorter than that of the cut off signal is used. In this case, as shown in FIG. 3, the input signal is to change during the down counting operation of the down counter 22. The change in an input signal during the down counting operation brings the down counter 22 to be reset to have its initial set value (the point C in FIG. 3). Therefore, in a duration D from the rising of the test signal inputted to the delay circuit 14 to the time at which the down count value becomes zero, the inputted value at the point A is to be maintained in the output signal. Since the duration of the test signal is shorter than the time determined by the initial set value and the period of the clock signal, the gate signal outputted from the cut off unit 3 is not brought into an off state, by which the outputs of the cut off unit 3 are kept in an on state. This makes none of the gate signals of the IGBTs in the bridge circuit 4 cut off. With the use of such a cut off signal and a test signal, the initial set value of the down counter 22 is set so that the time required for down counting is shorter than the allowable delay time of the cut off signal and longer than the pulse width of the test signal, by which a checking test can be carried out with respect to the connection to the cut off unit 3 so as not to affect the operation of the cut off unit 3.

In the case when a unit such as a CPU is used in the arithmetic circuit 11 that outputs the test signal, by using a clock signal, which is the same one as the clock signal used for the CPU, for the down counter 22 and the DFF 24 in the delay circuit 14, the test signal becomes in synchronization with the down counter 22 to facilitate monitoring of time. This necessitates no clock signal generating circuit and synchronizing circuit to be additionally provided, which enables realization of cost reduction of the electric power converter.

The arithmetic circuit 11 in the monitoring unit 10 is formed of a processor such as a CPU to have a monitoring means 50 that is actualized by means of a program. The monitoring means 50 is started at fixed cycles to carry out first monitoring processing for comparing a test signal with a feedback signal from the input signal to the delay circuit 14 (input side feedback signal) and second monitoring processing for comparing an inputted cut off signal with a feedback signal from the output signal of the cut off unit 3 (output side feedback signal).

Next, the processing step of the monitoring means 50 will be explained with the use of FIG. 4, a flow chart showing the steps of processing carried out in the monitoring means 50 in the arithmetic circuit 11 in FIG. 1. Incidentally, the CPU provided in the arithmetic circuit 11 is made to have a task structure that is made started by fixed cycle interruptions to alternately carry out route A processing for carrying out a test and route B processing for monitoring the cut off signal.

First, the monitoring means 50, being started by a fixed cycle interruption for which the frequency of the clock signal in the square wave generator 20 is divided, carries out a decision with respect to whether processing of the rout A or the rout B is to be executed (S101). Specifically, if the route A was executed at the last starting, the route B is selected and, if the route B was executed at the last starting, the route A is selected.

When the processing of the route A is selected as a result of the decision at the step 101, the monitoring means 50 reads a cut off signal (S102). When the cut off signal is in an off state, first monitoring processing is executed ("Yes" at S103). When the cut off signal is in an on state, the processing is terminated as it is ("No" at S103). This is because, when the cut off signal is in an on state, the whole state of the cut off unit 3 including every gate circuit 31 can be monitored in the following processing in the route B, by which the monitoring by a test signal is unnecessary.

Then, the monitoring means 50, as a first monitoring processing, first sets a selection signal to the switching circuit 12 onto the test signal side (S104) and subsequently, for preventing monitoring error due to a transient state in a switching operation in the switching circuit 12, sets a stand-by time A (S105). The stand-by time, being predetermined as being equivalent to several periods of the clock signal in the CPU, can be easily actualized by inserting a dummy instruction into the program, for example.

Following this, the monitoring means 50 makes the test signal in an on-state (S106) to set a stand-by time B with a delay in input processing taken into consideration (S107). The stand-by time B can be also set like the stand-by time A. After the stand-by time B elapsed, the monitoring means 50 reads a feedback signal (an input side feedback signal) of an input of the delay circuit 14 (S108) to compare the logic thereof with that of the test signal. When both of the signals are in disagreement with each other in the logic ("Yes" at S109), a decision is made that the case is abnormal, by which an alarm is externally outputted (S110). At this time, a cut off function can be provided independently of the cut off unit 3 so as to execute processing at abnormality detection such as processing of cutting off the output of PWM signals to the bridge circuit 4.

Thereafter, the monitoring means 50 stops outputting of the test signal and switches the selection signal so as to be set onto the original cut off signal side to terminate the processing in the route A (S111). Here, in the processing from step S106 to step S111, for making the processing time become enough shorter than the initial set value specified in the delay circuit 14 beforehand, interrupt must be made disabled at least during the time in which the above processing is carried out so that the processing time is not extended.

When the processing of the route B is executed as a result of the decision at the step S101, the monitoring means 50 reads the cut off signal (S112). When the cut off signal is "on", the monitoring means 50 executes second monitoring processing (S113). In the second monitoring processing, the monitoring means 50 reads a feedback signal (output side feedback signal) from the output of the cut off unit 3 (S114). When both of the cut off signal and the feedback signal are "on", the monitoring means 50 makes a decision that the case is normal ("No" at S115). When the feedback signal becomes "off", a decision is made that the case is abnormal ("Yes" at S115) and processing such as an external output of an alarm or execution of cut off by a cut off function provided independently of the cut off unit 3 (S116) is carried out.

Figure 4:
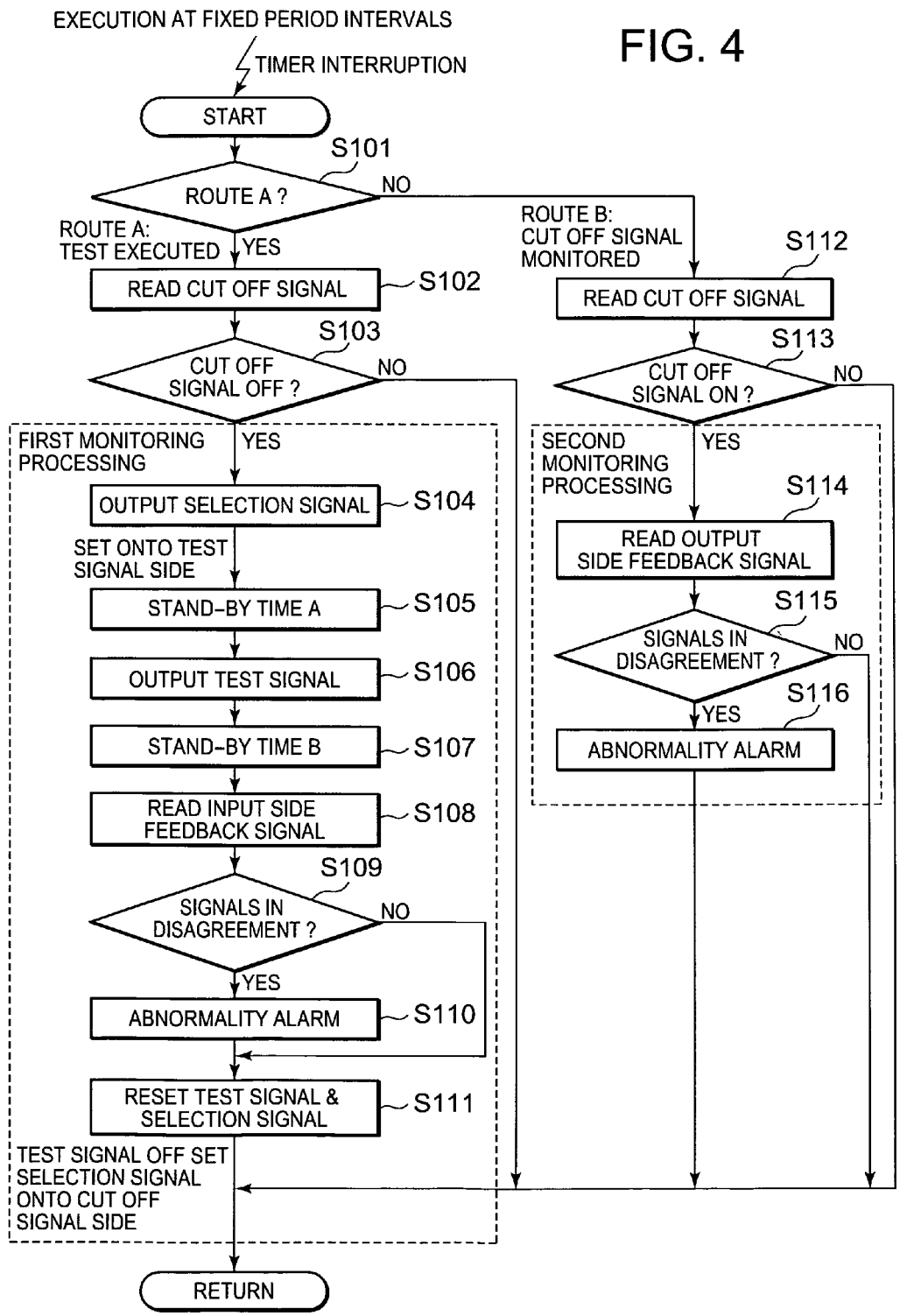
FIG. 4 is a flow chart showing the steps of processing carried out in the monitoring means in the arithmetic circuit shown in FIG. 1.

In this way, in fixed cycle processing of the monitoring means 50, by carrying out processing by route and carrying out monitoring while watching on and off states of the cut off signal in the respective routes as shown in the flow chart in FIG. 4, effective monitoring can be carried out.

As was explained in the forgoing, according to the embodiment, by using a test signal shorter than an allowable delay time from the input of an abnormal signal to the cut off of the cut off unit 3, an abnormal state of the cut off unit 3 can be detected without cutting off PWM signals outputted from the control unit 2. Moreover, with the system of using such a test signal combined with the monitoring system of comparing an externally inputted cut off signal and an output signal of the cut off unit 3, the reliability of monitoring abnormality can be enhanced.

ANOTHER EXAMPLE 1

Figure 5:
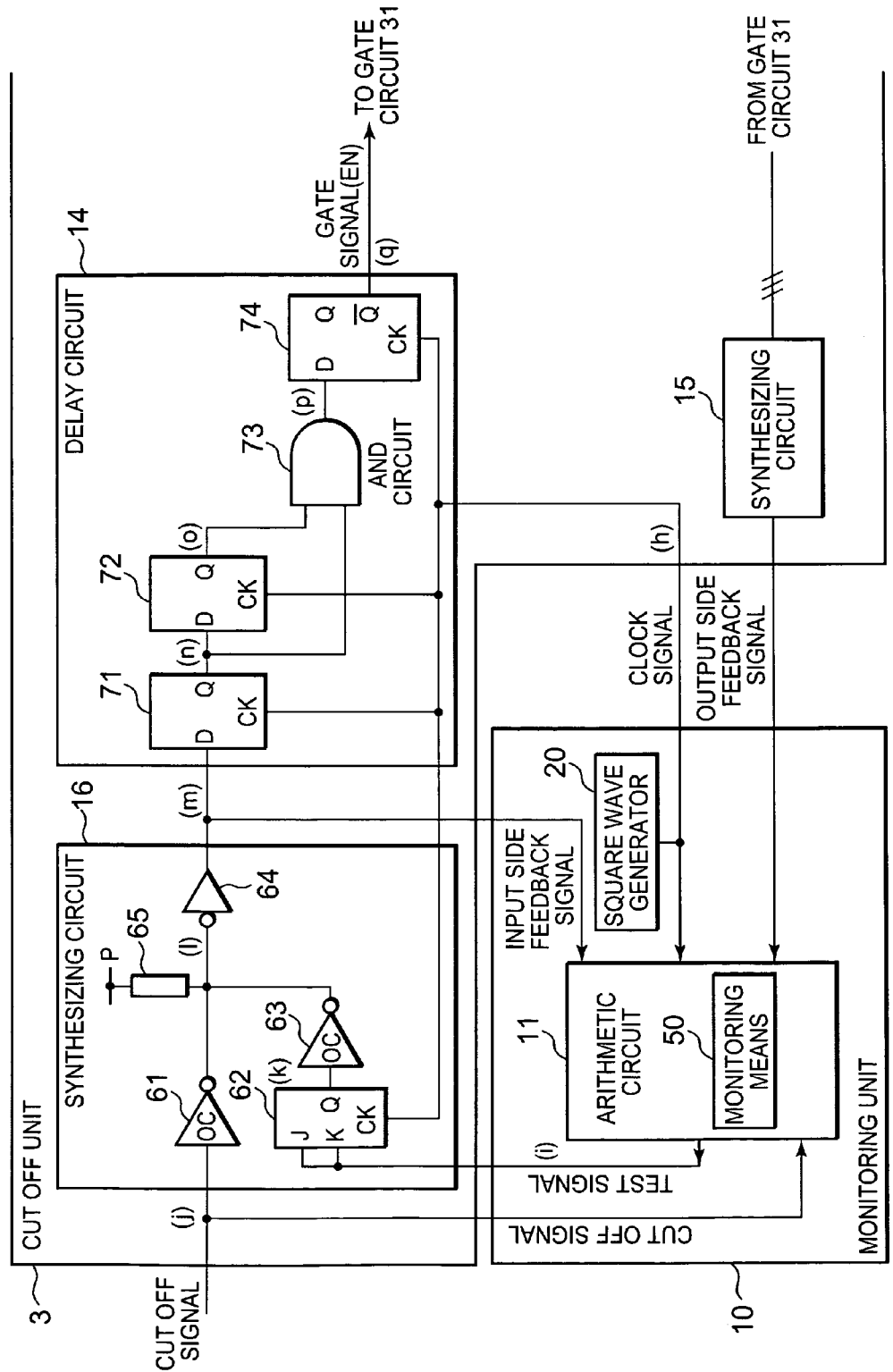
FIG. 5 is a block diagram showing circuit configurations of a cut off unit and a monitoring unit according to another example 1 of the embodiment of the invention.

Next, another example will be explained. FIG. 5 is a block diagram showing configurations of a cut off unit 3 and a monitoring unit 10 according to another example of the embodiment of the invention. In FIG. 5, only sections changed from those in FIG. 1 are shown. Therefore, configurations not shown in FIG. 5 are the same as those shown in FIG. 1.

A major difference from the configuration shown in FIG. 1 is that a synthesizing circuit 16 is provided instead of the switching circuit 12 to change the circuit configuration of the delay circuit 14. In the configuration shown in FIG. 5, like the configuration shown in FIG. 1, the configuration can be given so that the input processing circuit 13 is provided between the synthesizing circuit 16 and the delay circuit 14. In the invention, since the input processing circuit 13 is not indispensable, its illustration is omitted.

In the synthesizing circuit 16, a NOT circuit 61 has a cut off signal inputted to output an inverted signal. Moreover, a test signal outputted from the arithmetic circuit 11 is inputted to both of a J input and a K input of a JK flip-flop (hereinafter referred to as a "JKFF") 62. Incidentally, in the example, the test signal is made to be an input signal to the JKFF 62. However, with the JKFF 62 provided on the side of the monitoring unit 10, the output of the JKFF 62 can be served as the test signal.

The clock signal input terminal (CK) of the JKFF 62 is connected to the square wave generator 20 and the output terminal of the JKFF 62 is connected to the input terminal of a NOT circuit 63. The output terminals of the NOT circuits 61 and 63 are connected to the input terminal of a NOT circuit 64 and, along with this, are connected to a pull-up resistor 65. Moreover, the output terminal of the NOT circuit 64 is connected to a delay circuit 14 and the arithmetic circuit 11 in the monitoring unit 10. Here, each of the NOT circuits 61 and 63 is an open collector type device.

Furthermore, in a delay circuit 14, as shown in FIG. 5, an output from the synthesizing circuit 16 is inputted to the input terminal of a DFF 71 and the output terminal of the DFF 71 is connected to the input terminal of a DFF 72. In addition, both of the output terminals of the DFF 71 and the DFF 72 are connected to their respective input terminals of an AND circuit 73 and the output terminal of a result of a decision of the AND circuit 73 is connected to the input terminal of a DFF 74. The clock signal input terminal of each of the DFFs 71, 72 and 74 is connected to the square wave generator 20. An inverted output terminal of the DFF 74 is connected to the enable terminal of the gate circuit 31 to transmit a gate signal (EN) thereto.

Figure 6:
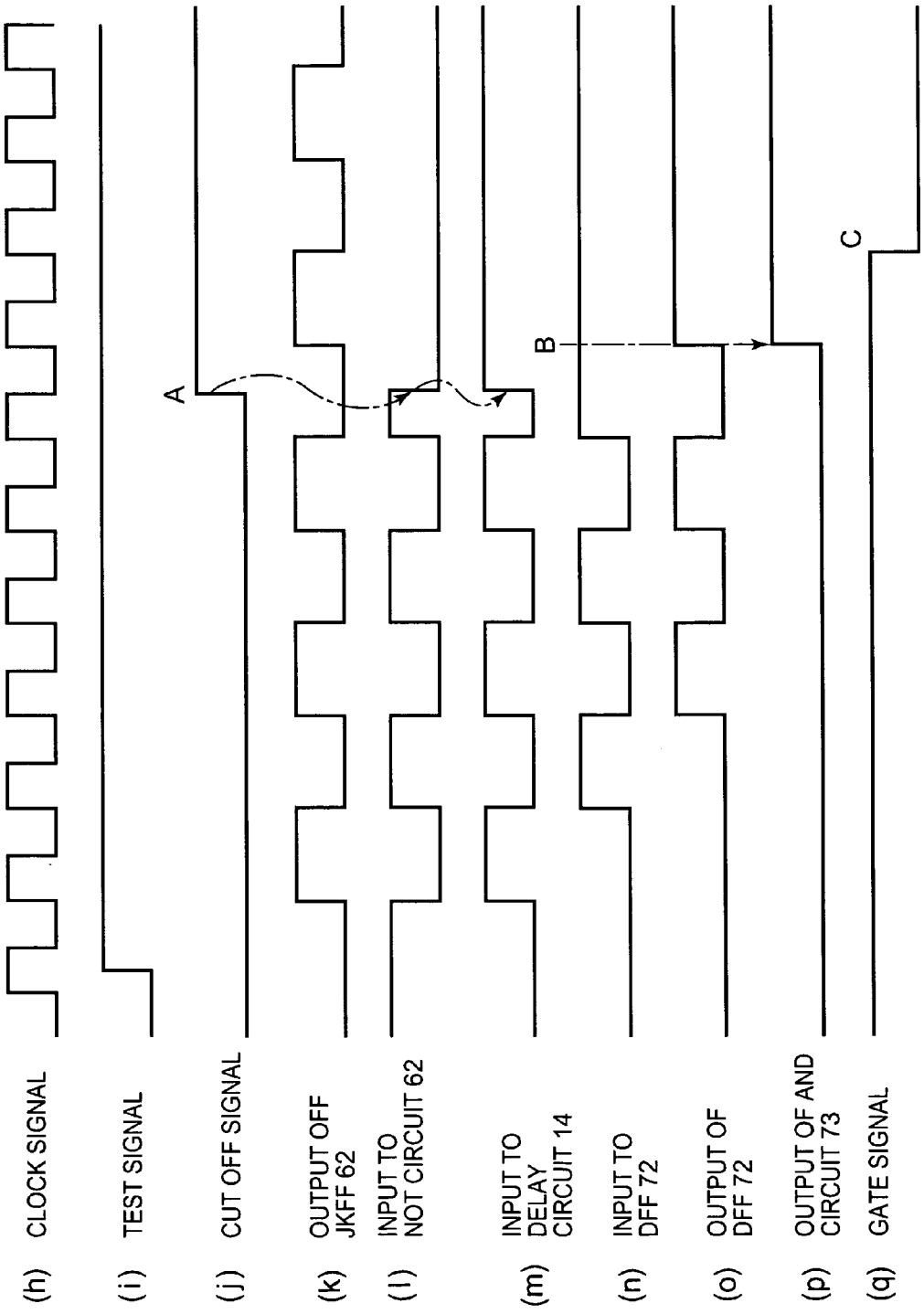
FIG. 6 is a timing chart for explaining operations of the cut off unit and the monitoring unit shown in FIG. 5.

In FIG. 6, a timing chart is shown which is for explaining operations of the cut off unit 3 and the monitoring unit 10 shown in FIG. 5. In the example, when the test signal is made "on" by the arithmetic circuit 11, the test signal and a cut off signal are synthesized by the synthesizing circuit 16. Namely, when the cut off signal is made to be "off", the JKFF 62 outputs an output signal that is inverted for each clock signal. As a result, from the synthesizing circuit 16, a test signal is outputted with a waveform pattern made inverted for each clock signal. With the cut off signal made to be "on" in this state (the point A in FIG. 6), the output of the NOT circuit 61 becomes "0" while the cut off signal is made to be "on". Thus, the output of the synthesizing circuit 16 becomes "1".

While, in the delay circuit 14, when the level of an input signal is kept at "1" for a length of time equal to or more than the length of two clock signals, the output of the AND circuit 73 becomes "1" (the point B in FIG. 6), the result of which is latched in the DFF 74 to be outputted as a gate signal (the point C in FIG. 6).

The test signal alternately repeats the state of the level "1" and the state of the level "0" for each clock signal. This makes the gate signal always in an "on" state. Thus, with the state of the cut off signal made "on" for a length of time equal to or more than the length of two clock signals, the gate signal is made to be off and the cut off unit 3 is made to be "off". In the example, when the cut off signal is made to be "on" with the test signal being made to be "off", it takes a length of time equal to at least the length of three clock signals until the gate signal is changed. Therefore, the period of the clock signal is to be determined with an allowable delay time of the cut off signal taken into consideration.

Figure 7:
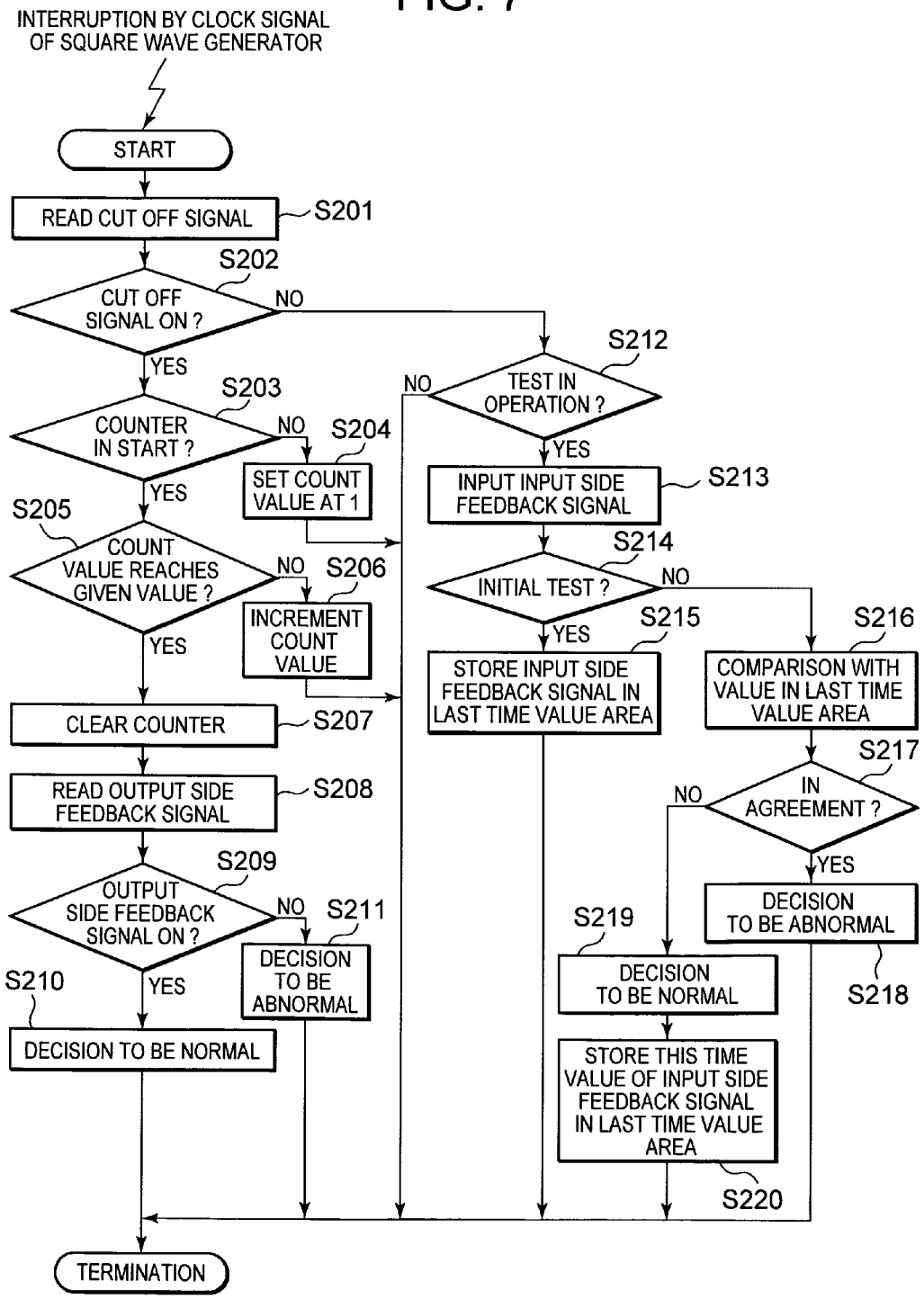
FIG. 7 is a flow chart showing the steps of processing carried out in the monitoring means in the arithmetic circuit shown in FIG. 5.

The monitoring means 50 in the arithmetic circuit 11 according to the example carries out abnormality detection by the steps of processing shown in a flow chart in FIG. 7. In the following, on the basis of FIG. 7, the operation of the monitoring means 50 will be explained.

The monitoring means 50, on being made started by fixed cycle interruption by the clock signal in the square wave generator 20, reads a state of the cut off signal (S201). The monitoring means 50, when the cut off signal is in an "on" state at step S202, makes a decision as to whether a counter in the arithmetic circuit 11 is in start or not (S203). When the counter is not on start, the counter is made to start counting with the count value set at 1 (S204).

While, when the counter is in start ("Yes" in S203), the monitoring means 50 makes a decision as to whether the count value reaches a given value or not (S205). When the count value does not reach the given value, the count value is incremented to terminate the processing (S206). The given value is a value determined by a theoretical delay time from the time at which a cut off signal is inputted to the time at which a gate signal is made to be "off". For the delay by three clock signals, the given value becomes three.

When the count value reaches the given value ("Yes" at S205), the monitoring means 50 clears the counter (S207) to read a state of an output side feedback signal (S208). Then, the monitoring means 50 makes a decision as to whether the read output side feedback signal is "on" or not (S209). When the read output side feedback signal is "on", a decision is made that the state is normal (S210). When the read output side feedback signal is "off", a decision is made that the state is abnormal (S210) to output an error signal (S211)

While, when the cut off signal is not in an "on" state at the step S202, the monitoring means 50 makes a decision as to whether or not a test is in operation, namely the test signal is in output (S212). When the test is in operation, an input side feedback signal is inputted (S213).

Subsequent to this, the monitoring means 50 makes a decision as to whether the test is first time one or not (S214). Namely, the monitoring means 50, with the test signal made "on", makes a decision as to whether the reading of an input side feed back signal is first time one or not. When the reading is first time one ("Yes" at S214), the processing is terminated with the value of the input side feed back signal stored in a last time value area in a memory in the arithmetic circuit 11 (S215). When the reading is not first time one at step S214, the monitoring means 50 compares the value in the last time value area with the value obtained this time (S216) to make a decision as to whether the values are in agreement with each other or not (S217). When the value in the last time value area is in agreement with the value obtained this time as a result of the comparison, the monitoring means 50 makes a decision that the state is abnormal (S218) to terminate the processing.

When the value in the last time value area is in disagreement with the value obtained this time, the monitoring means 50 makes a decision that the state is normal (S219) to store the value of the input side feedback signal obtained this time in the last time value area (S220) and terminate the processing.

In the example, since a test signal inputted to the delay circuit 14 is inverted for each period of the clock signal, when the operation is normal, a last time value is to be certainly different from a this time value. This results in execution of processing of decisions from step S217 to step S219.

According to the example explained in the foregoing, an electric power converter can be actualized with a circuit configuration with the number of constituents less than that in the configuration shown in FIG. 1. Moreover, since no switching circuit 12 is used, the possibility of transmitting no cut off signal is eliminated, which can actualize a system with higher reliability.

ANOTHER EXAMPLE 2

Figure 8:
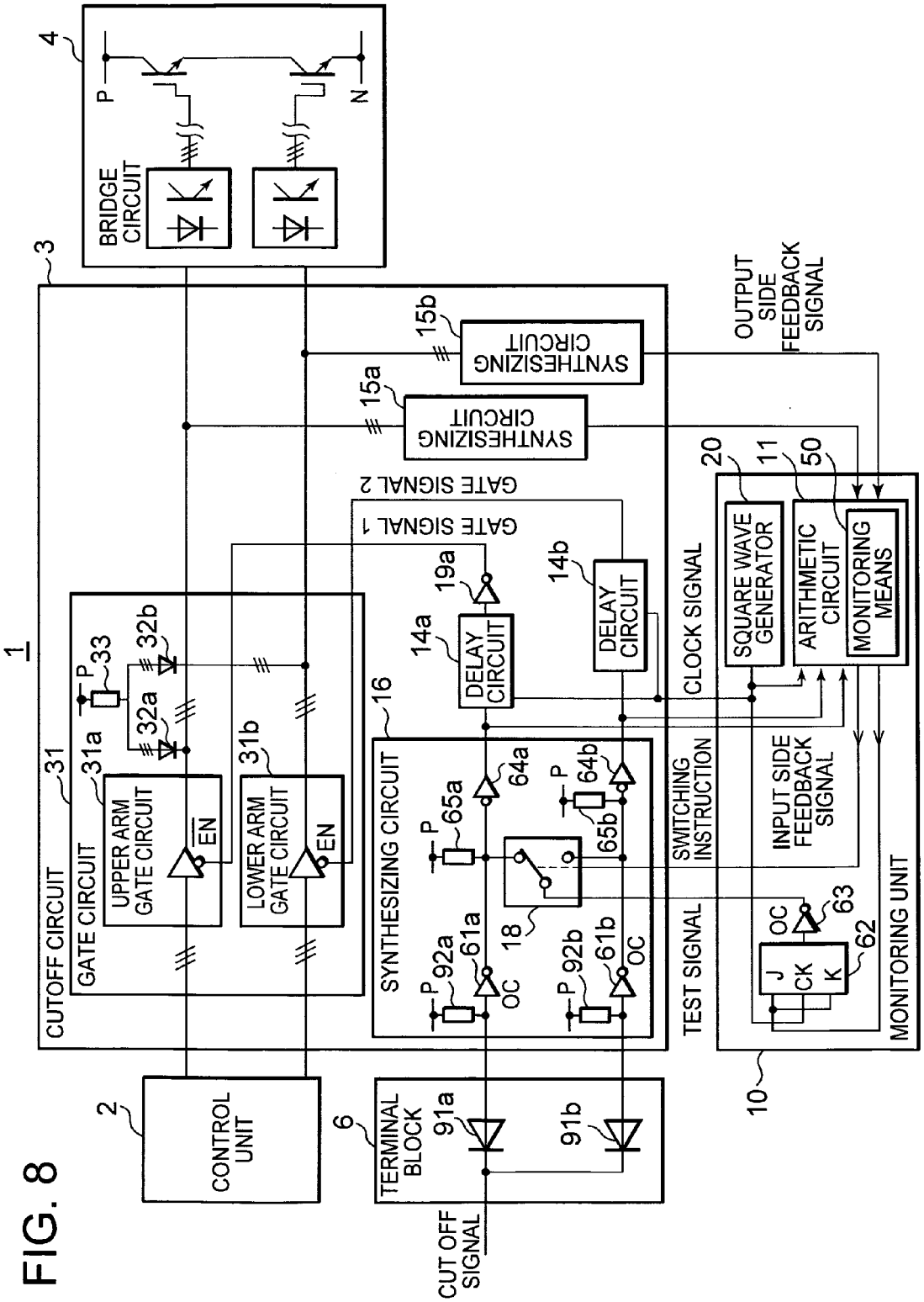
FIG. 8 is a block diagram showing the function of another example 2 of an electric power converter according to the embodiment of the invention.

FIG. 8 is a block diagram showing the function of another example 2 of an electric power converter 1 according to the embodiment of the invention. The example provides a cut off unit 3 with a configuration that can cut off a bridge circuit 4 by upper and lower arms. The cut off unit 3 is provided with a delay circuit 14a and a delay circuit 14b, each being the same as the delay circuit 14 shown in FIG. 5, for an upper arm gate circuit 31a and a lower arm gate circuit 31b, respectively. An output of the delay circuit 14a is used as a gate signal 1 after being inverted by a NOT circuit 19a. The upper arm gate circuit 31a is formed so that its output becomes "on" when the gate signal 1 is "0" and becomes "off" (cut off) when the gate signal 1 is "1". While, the lower arm gate circuit 31b is formed so that its output becomes "on" when the gate signal 2 is "1" and becomes "off" (cut off) when the gate signal 2 is "0".

A cut off signal is divided at a terminal block 6 into a cut off signal for the upper arm and a cut off signal for the lower arm which are inputted to a synthesizing circuit 16 through diodes 91a and 91b, respectively. To the synthesizing circuit 16, a test signal with a waveform pattern for testing is further inputted from the monitoring unit 10. In the synthesizing circuit 16, a configuration is provided so that connection of a transmission line of the waveform pattern of the test signal can be switched to either the transmission line of the cut off signal for the upper arm or the transmission line of the cut off signal for the lower arm by a switching circuit 18.

Output signals to the upper arm outputted from the upper arm gate circuit 31a and output signals to the lower arm outputted from the lower arm gate circuit 31b are also inputted to a synthesizing circuit 15a and a synthesizing circuit 15b, respectively, and synthesized by output signal to the upper arm and output signal to the lower arm. The synthesized signals are then outputted as output side feedback signals to be inputted to an arithmetic circuit 11 in a monitoring unit 10. The arithmetic circuit 11 in the monitoring unit 10 outputs a switching instruction to select an arm to be subjected to a test and further outputs a test signal for carrying out a test with respect to the selected arm. The example, however, is characterized in that the gate circuit is divided into the upper arm gate circuit and the lower arm gate circuit, each of which is cut off by an independent gate signal. Thus, the basic operation of the cut off unit is the same as that of another example 1. Therefore, an explanation of the operation will be omitted.

According to the example, even though either one of the upper arm gate circuit 31a or the lower arm gate circuit 31b is broken down, with the other one normally operated to allow the corresponding arm to be cut off, an electric power supply from the bridge circuit can be made stopped. Moreover, since the enable logic of the upper arm gate circuit is made reversed to that of the lower arm gate circuit, even though a gate circuit is short-circuited with its signal level pulled into a signal level of either one of a signal of the upper arm gate circuit or a signal of the lower arm gate circuit, either one of the gate circuits can be surely made off.

Furthermore, in the example, self-checking of the upper arm gate circuit and that of the lower arm gate circuit are alternately carried out, by which the reliability of the electric power converter can be further enhanced.

The present invention is not limited to the above described embodiment, but can be embodied with various modifications within a range without departing from the spirit and scope of the present invention. Moreover, the circuit in each of the examples can be independently applied. For example, it is also possible to apply the switching circuit and the delay circuit shown in FIG. 1 to each of the upper arm gate circuit and the lower arm gate circuit explained in another example 2.

What is claimed is:

1. An electric power converter for supplying power to a motor, comprising:
   a control unit outputting PWM signals;
   a bridge circuit producing AC electric power supplied to the motor, by turning semiconductor switching devices in the bridge circuit ON and OFF with the PWM signals;
   a cut off unit, provided between the control unit and the bridge circuit, for cutting the PWM signals supplied from the control unit off from the bridge circuit in response to a gate signal; and
   a monitoring unit generating a test signal for checking the cut off unit,
   wherein the cut off unit comprises:
      a switching circuit that switches between the test signal and an external cut off signal to output one of the test signal and the cut off signal as a switching circuit output signal;
      a delay circuit that receives the switching circuit output signal and allows the switching circuit output signal to pass through the delay circuit as a delayed signal after a predetermined time has elapsed from the time at which the switching circuit switches; and
      means for inputting the switching circuit output signal to the monitoring unit as a feedback signal,
   wherein the test signal generated by the monitoring unit has a duration shorter than the predetermined time of the delay circuit, and the monitoring unit makes a decision as to whether the feedback signal from the cut off unit is in agreement with the test signal and, if the feedback signal and the test signal are in disagreement with each other, makes a decision that the cut off unit is in an abnormal state.

2. The electric power converter as claimed in claim 1, wherein the monitoring unit receives the cut off signal and makes feedback signal of the cut off unit, makes a decision as to whether the cut off signal is inputted or not when the test signal and the feedback signal are in disagreement with each other, and makes a decision as to whether the cut off unit is abnormal or not on the basis of the output signal of the cut off unit when the cut off signal is inputted.

3. The electric power converter as claimed in claim 1, wherein the cut off unit further comprises:
   first means for cutting off PWM signals to upper arm semiconductor switching devices in the bridge circuit; and
   second means for cutting off PWM signals to lower arm semiconductor switching devices in the bridge circuit.

4. The electric power converter as claimed in claim 3, wherein one of the first and second means is connected to the delay circuit, and wherein the cut off unit further comprises another delay circuit, and means for connecting the another delay circuit to the other of the first and second means.

5. The electric power converter as claimed in claim 4, wherein the cut off unit further comprises means for connecting the delay circuit and the another delay circuit to the switching circuit.

6. An electric power converter for supplying power to a motor, comprising:
   a control unit outputting PWM signals;
   a bridge circuit producing AC electric power supplied to the motor by turning semiconductor switching devices in the bridge circuit ON and OFF with the PWM signals;
   a cut off unit, provided between the control unit and the bridge circuit, for cutting the PWM signals supplied from the control unit off from the bridge circuit in response to a gate signal; and
   a monitoring unit generating a test signal for checking the cut off unit,
   wherein the cut off unit comprises:
      a synthesizing circuit that carries out a logical OR operation between the test signal and the cut off signal produces a synthesizing circuit output signal;
      a delay circuit that receives the synthesizing circuit output signal and allows the synthesizing circuit output signal to pass through the delay circuit as a delayed signal after a predetermined time has elapsed from the time at which the synthesizing circuit output signal changes state; and
      means for inputting the synthesizing circuit output signal to the monitoring unit as a feedback signal, and
   wherein the test signal generated by the monitoring unit has a duration shorter than the predetermined time of the delay circuit, and the monitoring unit makes a decision as to whether the feedback signal from the cut off unit is in agreement with the test signal and, if the feedback signal and the test signal are in disagreement with each other, makes a decision that the cut off unit is in an abnormal state.

7. The electric power converter as claimed in claim 6, wherein the monitoring unit receives the cut off signal and the feedback signal of the cut off unit, makes a decision as to whether the cut off signal is inputted or not when the test signal and the feedback signal are in disagreement with each other, and makes a decision as to whether the cut off unit is abnormal or not on the basis of the output signal of the cut off unit when the cut off signal is inputted.

* * * * *